United States Patent [19]

Nitta

[11] Patent Number: 5,604,456
[45] Date of Patent: Feb. 18, 1997

[54] DIFFERENTIAL RS LATCH CIRCUIT

[75] Inventor: Shozo Nitta, Tokyo, Japan

[73] Assignee: Kabushiki Kaisha Toshiba, Kawasaki, Japan

[21] Appl. No.: 576,370

[22] Filed: Dec. 21, 1995

[30] Foreign Application Priority Data

Jan. 17, 1995 [JP] Japan ................. 7-005136

[51] Int. Cl.⁶ ............... H03K 3/037; H03K 3/26
[52] U.S. Cl. .............. 327/217; 327/220; 327/222; 327/563
[58] Field of Search ............... 327/215, 217, 327/219, 220, 222, 223, 199, 208, 405, 563, 478, 482, 491

[56] References Cited

U.S. PATENT DOCUMENTS

| | | | |
|---|---|---|---|
| 3,430,070 | 2/1969 | Marshall, Jr. et al. | 327/217 |
| 3,833,824 | 9/1974 | Parks | 327/217 |
| 4,001,608 | 1/1977 | Zuk | 327/217 |
| 4,145,623 | 3/1979 | Doucette | 327/217 |
| 4,306,162 | 12/1981 | Hart | 327/217 |
| 4,553,046 | 11/1985 | Alzati et al. | 327/217 |
| 4,714,837 | 12/1987 | Wilson et al. | 327/217 |
| 4,791,315 | 12/1988 | Gontowski, Jr. | 327/217 |
| 4,855,617 | 8/1989 | Ovens | 327/217 |

FOREIGN PATENT DOCUMENTS

| | | | |
|---|---|---|---|
| 403215A2 | 12/1990 | European Pat. Off. | 327/217 |
| 352032654 | 3/1977 | Japan | 327/217 |
| 352058446 | 5/1977 | Japan | 327/217 |
| 401185014 | 7/1989 | Japan | 327/217 |
| 1370732 | 1/1988 | U.S.S.R. | 327/217 |
| 2120888 | 12/1983 | United Kingdom | 327/217 |

*Primary Examiner*—Timothy P. Callahan
*Assistant Examiner*—My-Trang Nu Ton
*Attorney, Agent, or Firm*—Oblon, Spivak, McClelland, Maier & Neustadt, P.C.

[57] ABSTRACT

A differential RS latch circuit has a series structure wherein a first differential transistor pair, a second differential transistor pair and a third differential transistor pair are connected in three stages, and jointly function as one current switch. A first diode serving as a first level shift element is provided in a first current path between a power source node and a grounding node, and second and third diodes serving as second and third level shift elements are provided in a second current path between the power source node and the grounding node. The number of elements provided in the first current path is equal to that of elements provided in the second current path. As a result, the first and second current paths are equal to each other in response speed to a signal, and thus an hazard is prevented from occurring even at the time of the switching operation between the first and second current paths.

7 Claims, 3 Drawing Sheets

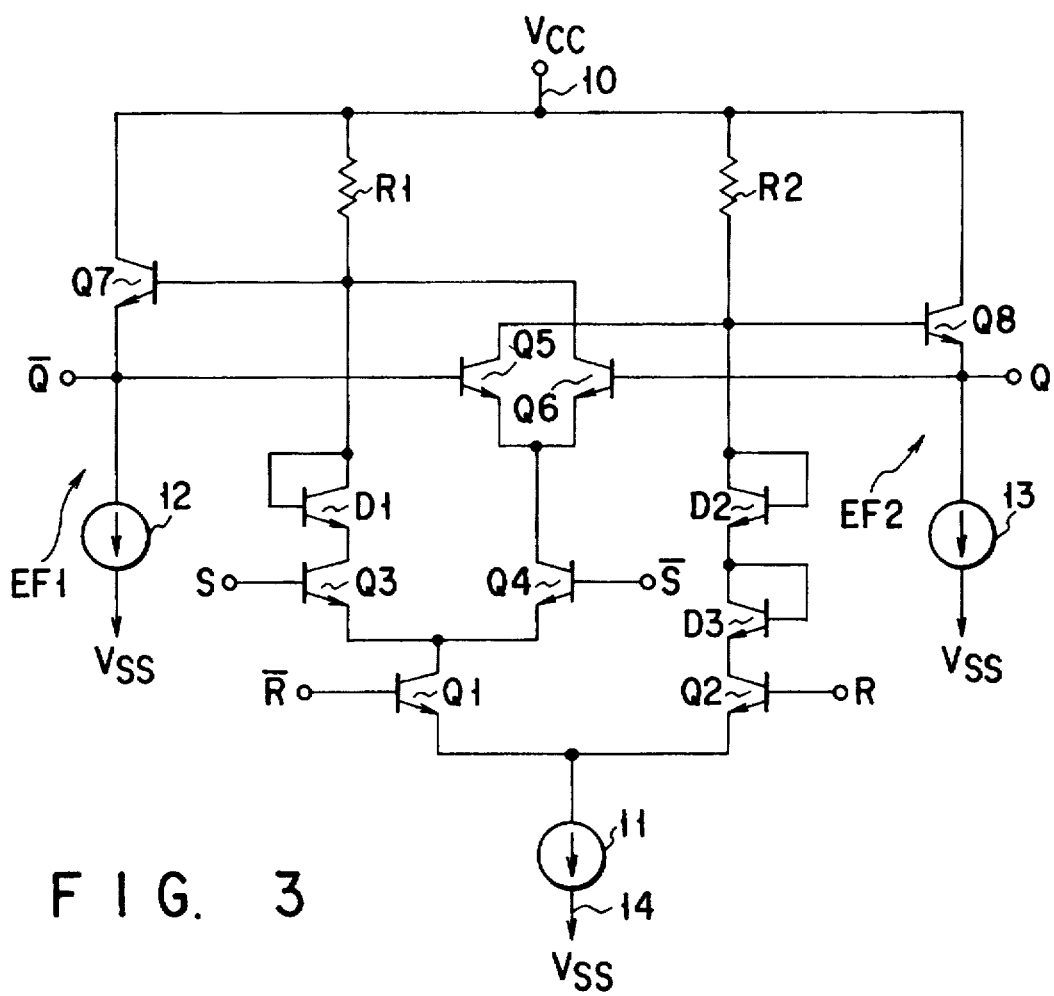
F I G. 3

DIFFERENTIAL RS LATCH CIRCUIT

BACKGROUND OF THE INVENTION

1. Field of the Invention

The present invention relates to a differential RS latch circuit for use in a semiconductor integrated circuit such as an ECL (emitter-coupled logic) gate array for use in a high-speed digital circuit, and more particular to a differential RS latch circuit which causes no output hazard.

2. Description of the Related Art

In general, an RS latch circuit operates according to the following truth table:

| Reset input R | "0" | "1" | "0" | "1" |
|---|---|---|---|---|
| Set input S | "0" | "0" | "1" | "1" |
| Output Qn | Qn − 1 | "0" | "1" | "φ" |

When R=S="0", the output Qn−1 is generated before the output Qn. The output "φ" generated when R=S="1" (prohibited output) is either "0" or "1". A circuit which outputs "0" ("φ"="0") is called first-to-reset type RS latch circuit, and a circuit which outputs "1" ("φ"="1") is called first-to-set type RS latch circuit.

The operation of the first-to-reset type RS latch circuit is given by the following logical expression:

$$\begin{aligned} Qn &= \bar{R} \cdot \bar{S} \cdot Qn-1 + \bar{R} \cdot S & (1) \\ &= \bar{R} \cdot (\bar{S} \cdot Qn-1 + S) \\ &= \bar{R} \cdot (S + Qn-1) \\ &= \overline{\{R + \overline{(S+Qn-1)}\}} \end{aligned}$$

The operation of the first-to-set type RS latch circuit is given by the logical expression:

$$\begin{aligned} Qn &= \bar{R} \cdot \bar{S} \cdot Qn-1 + \bar{R} \cdot S + R \cdot S & (2) \\ &= \bar{R} \cdot \bar{S} \, Qn-1 + S \\ &= \bar{R} \cdot Qn-1 + S \\ &= \overline{\{\overline{(\bar{R} \cdot Qn-1)} \cdot \bar{S}\}} \end{aligned}$$

FIG. 1 is a logic circuit diagram showing the first-to-reset RS latch circuit constituted by NOR gates 41 and 42.

FIG. 2 is a circuit diagram showing a conventional differential RS latch circuit having an ECL gate. The conventional differential RS circuit of FIG. 2 is designed to effect a differential logic function, on the basis of the RS latch circuit of FIG. 1.

In FIG. 5, Q51 to Q76 denote NPN transistors, and R51 to R54 and R67 to R76 denote resistances. The transistors Q51 and Q52, transistors Q53 and Q54, transistors Q55 and Q56, and transistors Q57 and Q58 are differential pairs, respectively. The transistors Q59 to Q66 are parts of emitter follower circuits, and the transistors Q67 to Q76 are parts of current source circuits, respectively. A bias voltage Vcc is applied to the base of each of the transistors Q67 to Q76.

The structure and operation of the above differential RS latch circuit are well known, and will be explained but briefly.

In the differential RS latch circuit, a signal is delayed by time ts as it is transmitted from a set input S node to an output Qn node. The delay time ts is twice as much as the time tr by which a signal is delayed as is transmitted from a reset input R node to the output Qn node. The response speed to set input at which the set input is processed in the RS latch circuit differs from that for reset input at which the reset input is processed in the RS latch circuit.

If each of the currents flowing through current source circuits shown in FIG. 2 has a value Io, their total value is 10×Io. The total consumption of the currents is large.

As is clear from the above, the conventional differential RS latch circuit has problems. First, the response speed at which the set input is processed in the RS latch circuit differs from that at which the reset input is processed in the RS latch circuit. Second, a large number of current source circuits are required. Third, the current consumption is large. In addition, a transient erroneous operation (hazard) occurs at the time of a switching operation, e.g., the time when one current path is switched to another.

SUMMARY OF THE INVENTION

The object of the present invention is to provide a differential RS latch circuit which solves the above problems of the conventional RS latch circuit, reduces the difference between the response speed to set input at which the set input is processed in the RS latch circuit and the response speed to reset input at which the reset input is processed in the RS latch circuit, has a small number of current source circuits, as a result of which the consumption of current is small, and causes no transient erroneous operation (hazard).

In order to achieve the above object, the differential RS latch circuit of the present invention comprises:

a first differential transistor pair consisting of first differential transistors Q1 and Q2 which receive first complementary input signals, respectively;

a second differential transistor pair consisting of second differential transistors Q3 and Q4 which have a common emitter-coupled node connected to the collector of the first differential transistor Q1, and which receive second complementary input signals, respectively;

a first resistance and a first level shift element D1 which are connected successively in series between a first power source node and the collector of the second differential transistor Q3;

a second resistance, a second level shift element D2, and a third level shift element D3 which are connected successively in series between the first power source node and the collector of the first differential transistor Q2;

a first emitter follower circuit EF1 which has an output node serving as a first latch output node and an input node connected to a series-connection node between the first resistance and the first level shift element D1;

a second emitter follower circuit EF2 which has an input node connected to a series-connection node between the second resistance and the second level shift element D2, and an output node serving as a second latch output node which pairs with the first latch output node as a complementary pair;

a current source circuit 11 connected between a second power source node and an emitter-coupled node between the first differential transistors Q1 and Q2; and a third differential transistor pair consisting of third differential transistors Q5 and Q6 which have emitters, respectively, connected to the collector of the second differential transistor Q4, bases respectively connected to the first latch output node and the second latch output node, and collectors respectively connected to the input node of the second emitter follower circuit and the input node of the first emitter follower input node.

As stated above, the differential RS latch circuit of the present invention has a series-gate structure wherein the first differential transistor pair, the second differential transistor pair, and the third differential transistor pair are connected in series in three stages in a column direction as viewed in the drawings, and constitute one current switch. Both the response to the set input and the response to the reset input are performed by the current switch. By virtue of this structure, the differential RS latch circuit of the present invention can reduce the difference between the response speeds of the RS latch circuit to the set input and the reset input, and has a small number of current source circuits, as a result of which the consumption of the current is small, as compared with the conventional differential RS latch circuit. Furthermore, the first level shift element is connected to one of the second differential transistors, and the second and third level shift elements are connected in series to one of the first differential transistors. A diode serving as the first level shift element is provided in a current path between the first power source node and the grounding node, and diodes serving as the second and third level shift elements are provided in another current path between the first power source node and the grounding node, as a result of which the number of elements provided in one of the above current paths is equal to that of elements provided in the other current path. Thus, the current paths are equal to each other in response speed to any of the complementary input signals. By virtue of this feature, a transient erroneous operation (hazard) is prevented from occurring even at the time of a switching operation between the current paths.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a circuit diagram showing a first-to-reset type differential RS latch circuit according to the first embodiment of the present invention;

DETAILED DESCRIPTION OF THE PREFERRED EMBODIMENTS

Figure 1:
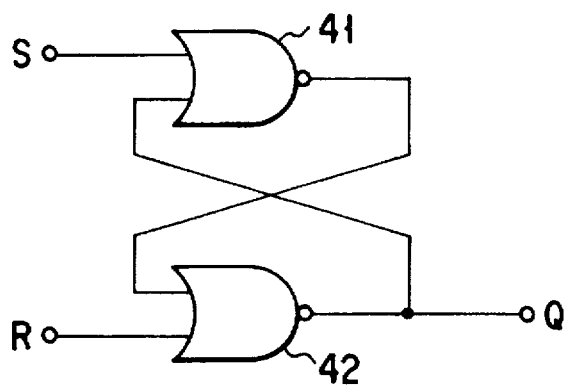
FIG. 1 is a logic circuit diagram showing a conventional first-to-reset type RS latch circuit.
Figure 2:
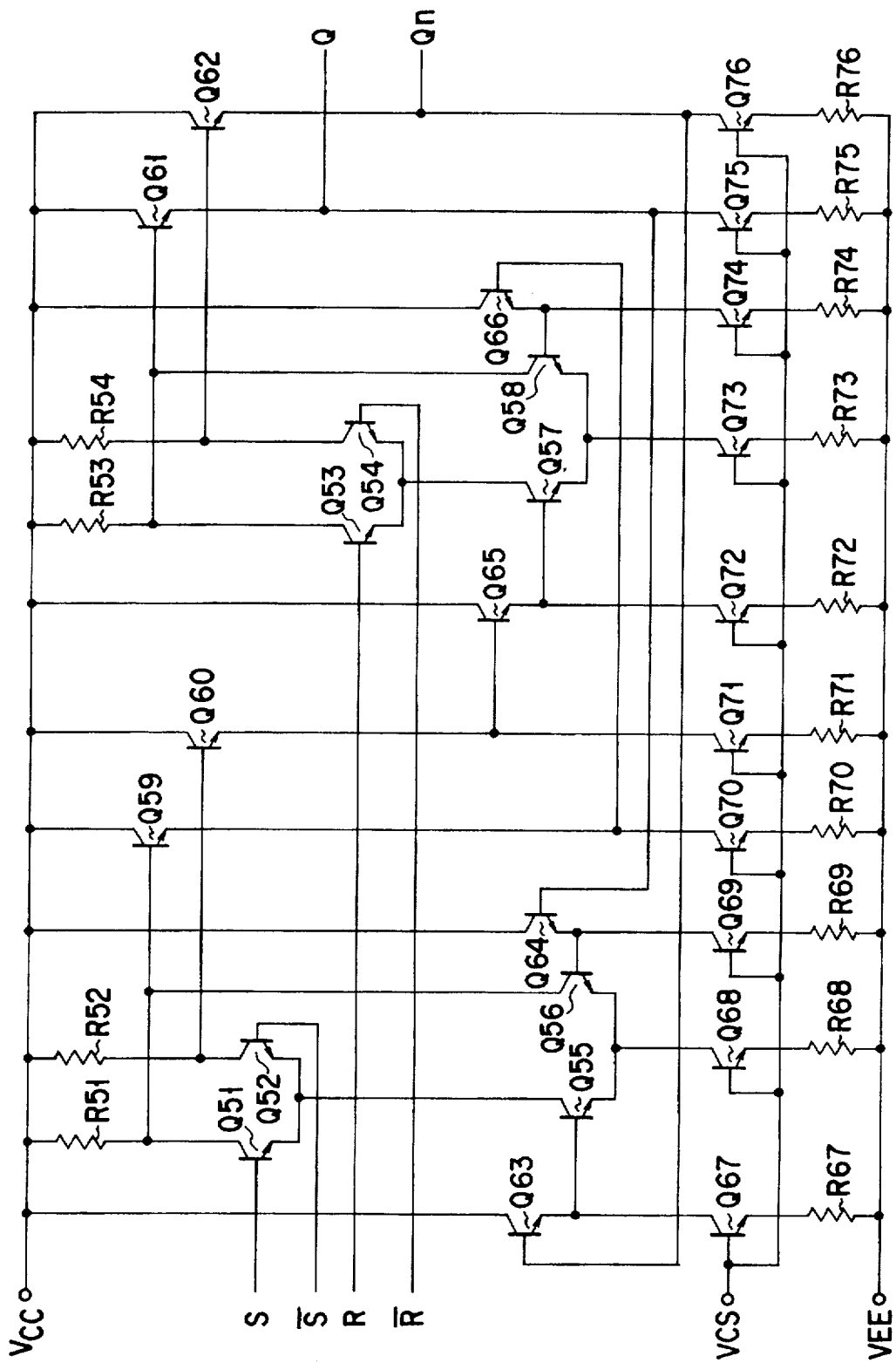
FIG. 2 is a circuit diagram showing a conventional differential RS latch circuit having an ECL gate, which is formed on the basis of the RS latch circuit shown in FIG. 1.

The embodiments of the present invention will be explained with reference to the accompanying drawings as follows:

FIG. 3 shows a first-to-reset type differential RS latch circuit according to the first embodiment of the differential RS latch circuit of the present invention.

In FIG. 3, Q1 and Q2 denote a pair of first differential NPN transistors which receive first complementary input signals corresponding to reset signals $\overline{R}$ and R. Q3 and Q4 denote a pair of second differential NPN transistors which have a common emitter-coupled node connected to the collector of the transistor Q1 of the first differential NPN transistor pair, and receive second complementary input signals which correspond to set signals S and $\overline{S}$.

A first resistance R1 and a first diode D1 serving as a first level shift element are successively connected in series between a first power source node 10 which corresponds to a source node, to which a power source potential Vcc is applied, and the collector of the transistor Q3 of the second differential NPN transistor pair.

A first current source circuit 11 is connected between a second power source node corresponding to a grounding node, to which a ground potential Vss is applied, and the emitter-coupled node between the transistors Q1 and Q2.

A second resistance R2, a second diode D2 and a third diode D3 are successively connected in series between the first power source node 10 and the collector of the transistor Q2 of the first differential NPN transistor pair.

EF1 denotes a first emitter follower circuit which comprises an NPN transistor Q7 having a collector connected to the power source node 10 and a base (input node) connected to the anode of the diode D1, and a second current source 12 connected to the emitter of the transistor Q7. The emitter serves as a first latch output node which corresponds to an inverter output node $\overline{Q}$.

EF2 denotes a second emitter follower circuit which comprises an NPN transistor Q8 having a collector connected to the power source node 10 and a base (input node) connected to the anode of the second diode D2, and a third current source 13 connected to the emitter of the transistor Q8. The emitter of the transistor Q8 serves as a second latch output node which corresponds to an output node Q. The second latch output node and the first latch output node constitute a complementary pair.

Q5 and Q6 denote a pair of third differential NPN transistors. Both the emitters of the third differential NPN transistors Q5 and Q6 are connected to the collector of the transistor Q4, the bases of the transistors Q5 and Q6 are connected to the first latch output node $\overline{Q}$ and the second latch output node Q, respectively, and the collectors of the transistor Q5 and Q6 are connected to the anode of the second diode D2 and the anode of the first diode D1, respectively.

The operation of the above first-to-reset differential RS latch circuit will be explained with reference to the aforementioned truth table as follows:

When R="1" ($\overline{R}$="0"), the transistor Q2 of the first differential NPN transistor pair is turned on, the transistor Q1 of the first differential NPN transistor pair is turned off, and current flows from the power source node 10 to the grounding node through the resistance R2, the diodes D2 and D3, the transistor Q2 and the first current supply circuit 11. At this time, the anode potential of the diode D2 decreases due to a voltage drop of the resistance R2, and the output Q of the second emitter follower circuit EF2 becomes "0". Therefore, when R=S="1" (prohibited output), the output Q is "0".

In the case where R="0" ($\overline{R}$="1"), when S="1" ($\overline{S}$="0"), the transistor Q3 of the second differential NPN transistor pair is turned on, the transistor Q4 of the second differential NPN transistor pair is turned off, the transistor Q1 of the first differential NPN transistor pair is turned on, and the transistor Q2 of the first differential NPN transistor pair is turned off. As a result, current flows from the power source node 10 to the grounding node through the resistance R1, the diode D1, the transistors Q3 and Q1, and the first current source circuit 11. At this time, the anode potential of the diode D1 decreases due to a voltage drop of the resistance R1. The output Q of the first emitter follower circuit EF1 becomes "0", and the output Q of the second emitter follower circuit EF2 becomes "1".

In the case where R="0" ($\overline{R}$="1"), when S="0" ($\overline{S}$="1"), the transistor Q4 of the second differential NPN transistor pair is turned on, the transistor Q3 of the second differential NPN transistor pair is turned off, the transistor Q1 of the first differential NPN transistor pair is turned on, and the transistor Q2 of the first differential NPN transistor pair is turned off.

At this time, when the output Qn−1 of the second emitter follower circuit EF2, which is the output before the output Qn, is "0", the transistor Q5 of the third differential NPN transistor pair is turned on, and the transistor Q6 of the third differential NPN transistor pair is turned off. Thus, current flows from the power source node to the grounding node through the resistance R2, the transistors Q5, Q4 and Q1, and the first current source circuit 11. Therefore, the anode potential of the diode D2 decreases due to a voltage drop of the resistance R2, and the output Q of the first emitter follower circuit EF2 becomes "0".

On the other hand, when the output Qn−1 of the second emitter follower circuit EF2 is "1", the transistor Q6 of the third differential NPN transistor pair is turned on, and the transistor Q5 of the third differential NPN transistor pair is turned off. Thus, current flows from the power source node to the grounding node through the resistance R1, the transistors Q6, Q4 and Q1, and the first current source circuit 11. Therefore, the anode potential of the diode D1 decreases due to a voltage drop of the resistance R1, the output Q of the first emitter follower circuit EF1 becomes "0", and the output Q of the second emitter follower circuit EF2 becomes "1".

The above differential RS latch circuit, as shown in FIG. 3, has the following series-gate structure: the third differential transistor pair (Q5 and Q6), the second differential transistor pair (Q3 and Q4) for use in inputting the set input, and the first differential transistor pair (Q1 and Q2) for use in inputting the reset input are connected in series in the three stages between the power source node 10 and the grounding node, and constitute one current switch.

Furthermore, the transistors Q5 and Q6 provided at the third stage of the above stages are connected to each other in such a manner as to constitute a part of a positive feedback loop which performs a data latch operation.

Specifically, the output of the first emitter follower circuit EF1 is positively fed back to the input side through the transistors Q5 and Q6, the resistances R1 and R2 and the second emitter follower circuit EF2. The output of the second emitter follower circuit EF2 is positively fed back to the input side through the transistors Q5 and Q6, the resistances R1 and R2, and the first emitter follower circuit EF1.

In the RS latch circuit having the above structure, when the set input S or the reset input R is input, one current switch (which is a circuit portion excluding the emitter follower circuits) responds to the set input S or the reset input R. Thus, the delay time by which the set input S is delayed as it is transmitted from the set input S node to the output Q node is equal to the delay time by which the reset input R is delayed as it is transmitted from the reset input R node to the output Q node. The above delay time of the set input S or the reset input R corresponds to the delay time by which it is delayed as it is transmitted through the gate (the current switch and the emitter follower circuit EF1 or EF2) of one of the above three stages. Therefore, the difference between the response speed to the set input and that to the reset input is considerably reduced, as compared with a conventional RS latch circuit.

In this case, the RS latch circuit has an advantage wherein the noise properties are high, since the RS latch circuit has a differential structure.

Furthermore, in the case where current source circuits are provided for the transistors Q1 and Q2, the first emitter follower circuit EF1, and the second emitter circuit EF2, respectively, the number of current source circuits to be provided is three or less, and thus the total power consumption of the RS latch circuit is greatly decreased. Furthermore, even if emitter follower circuits for use in level shift are provided in the front stage of the reset input node and the set input node, the number of current source circuits is merely increased to 7; i.e. it is smaller than that of current source circuits used in the conventional differential RS latch circuit, which is 10. In other words, it can be seen even that the power consumption can be decreased by 30%, as compared with that of the conventional RS latch circuit.

Due to provision of the diodes D1 to D3, the response speeds of the current paths are equal to each other, and an "output hazard" is prevented even at the time of the switching operation of the differential pair.

The term "output hazard" used therein is intended to means a transient erroneous output waveform which would generate at the time of the switching operation of the differential transistor pair.

The diodes D1 to D3 prevent occurrence of the output hazard as follows:

For example, if in the initial state, R is "1" ($\overline{Q}$="1") and $\overline{S}$="1", the transistor Q2 is in the ON state, current flows from the power source node 10 to a grounding node 14 through a current path extending via the resistance R2, the diodes D2 and D3, the transistor Q2, and the first current source circuit 11, the base potential of the transistor Q8 is low due to a voltage drop of the resistance R2, and the output Q of the second emitter follower circuit EF2 is "0".

When R is changed from "1" (the initial state) to "0", the transistors Q2 of the first differential NPN transistor pair is switched from the ON state to the OFF state, and the transistor Q1 of the first differential NPN transistor pair is switched from the OFF state to the ON state, and the above current path is switched to another current path extending via the resistance R2, the transistors Q5, Q4 and Q1 and the first current source circuit 11.

When one of the current paths is switched to the other, if the current paths differed in the number of transistors from each other, the amount of current flowing through the resistance R2 would change for an instant, the voltage thereof would drop, the base potential of the transistor Q8 and the output Q of the second emitter follower circuit EF2 would vary for an instant, and an output hazard would occur.

However, in the above embodiment, the diodes D2 and D3 are provided as mentioned above, as a result of which the number of elements of said one of the above current paths is equal to that of elements of the other current path. Therefore, even in the case where said one of the current paths is switched to the other current path, the amount of current flowing through the resistance R2 is prevented from varying, and as a result, an output hazard is also prevented from occurring.

Furthermore, presuming that in the initial state, S="1" ($\overline{Q}$="1") and R="0, when S is changed from "1" (the initial state) to "0", the amount of current flowing through the resistance R1 is prevented from varying, and thus an output hazard is also prevented from occurring. This is because the diode D1 is provided, so that the number of elements provided in the current path extending from the power source node 10 to the grounding node via the resistance R1 is equal to the number of elements provided in the current path extending from the power source node 10 to the grounding node via the resistance R1.

As described above, it is preferable that the response speeds of the current paths be equal to each other. In this case, the diodes D1 to D3 can be replaced by NPN transistors each of which has the same characteristics as the NPN transistors Q1 to Q6, including a base and an emitter connected (diode-connected) to each other.

Figure 4:
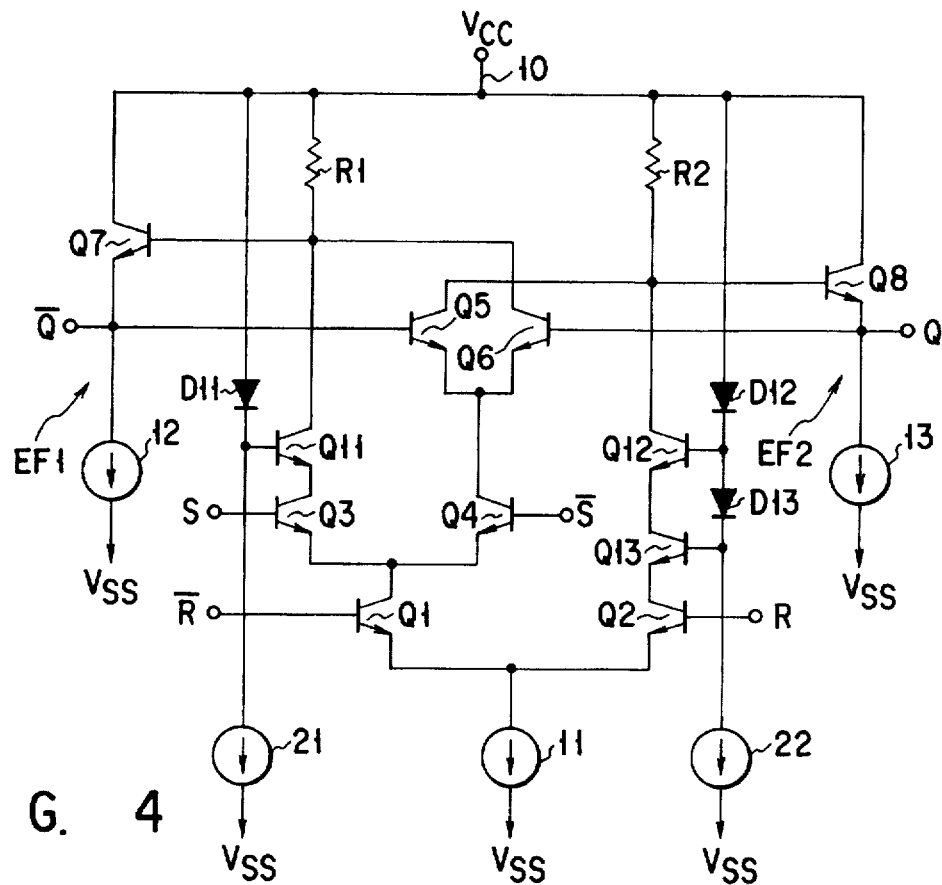
FIG. 4 is a circuit diagram showing a modification of the differential RS latch circuit shown in FIG. 3.

Another type of a level shift element can also be used in place of each of the diodes D1 to D3. FIG. 4 shows a modification of the differential RS latch circuit shown in FIG. 3.

The first-to-reset type differential RS latch circuit shown in FIG. 4 has base-ground type NPN transistors Q11 to Q13 in place of the diodes D1 to D3, which are used in the differential RS latch circuit shown in FIG. 3. In this regard, the differential RS latch circuit of FIG. 4 differs from the differential RS latch circuit of FIG. 3. The other portions of the differential RS latch circuit of FIG. 4 are the same as those of the differential RS latch circuit of FIG. 3, and denoted by the same reference numerals as those of the differential RS latch circuit of FIG. 3.

The transistor Q11 for use in level shift has a collector and an emitter which are connected between the resistance R1 and the collector of the transistor Q3, and a base which is connected to the power source node 10, with a diode 11 interposed therebetween, and which is connected to the grounding node, with a current source circuit 21 interposed between the base and the grounding node.

The emitter of the transistor Q13 for use in level shift is connected to the collector of the transistor Q2, the collector of the transistor Q13 is connected to the emitter of the transistor Q12, and the collector of the transistor Q12 is connected to the resistance R2.

A diode D12 is connected between the base of the transistor Q12 and the power source node 10, and a diode D13 is connected between the base of the transistor Q12 and the base of the NPN transistor Q13.

A current source circuit 22 is connected between the base of the NPN transistor Q13 and the grounding node.

The operation of the differential RS latch circuit of FIG. 4 is basically the same as that of the differential RS latch circuit according the above embodiment. However, in the differential RS latch circuit of FIG. 4, the AC impedance of each of the diodes D11 to D13 is low, the AC characteristics of each of the NPN transistors Q11 to Q13 are improved, and the NPN transistors Q11 to Q13 can operate at a higher speed than the diodes D1 to D3 of the above embodiment.

Figure 5:
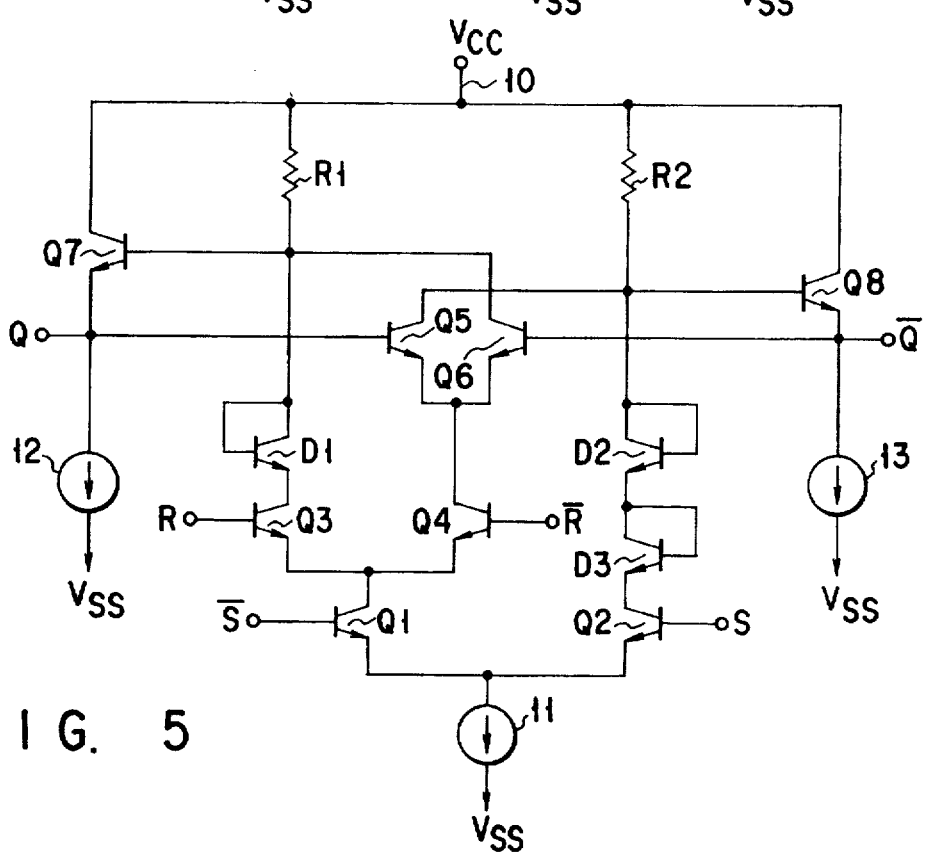
FIG. 5 is a circuit diagram showing a first-to-set type differential RS latch circuit according to second embodiment of the present invention.

FIG. 5 shows a first-to-set type differential RS latch circuit according to the second embodiment of the present invention.

In the first-to-set type differential RS latch circuit shown in FIG. 5, complementary set signals are input to a pair of first differential transistors Q1 and Q2, and complementary reset signals are input to a pair of second differential transistors Q3 and Q4. In this regard, the differential RS latch circuit of FIG. 5 differs from the differential RS latch circuit of FIG. 3. Except for this regard, the circuit arrangement shown in FIG. 5 is similar to hat shown in FIG. 3, and in FIG. 5, the same reference numerals as used in FIG. 3 are used to denote the corresponding structural elements.

The differential RS latch circuit of FIG. 5 operates in the same manner as the differential RS latch circuit of FIG. 3, and obtains substantially the same advantageous effects as the differential RS latch circuit of FIG. 3.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents, for example, with appropriate circuit modification, the circuits in FIGS. 3–5 can also be made using the field-effect transistors (FETs).

What is claimed is:

1. A differential RS latch circuit by comprising:

a first differential transistor pair consisting of first differential transistors which receive first complementary input signals, respectively;

a second differential transistor pair consisting of second differential transistors which have a common emitter-coupled node connected to a collector of one of said first differential transistors, and which receive second complementary input signals, respectively;

a first resistance and a first level shift element which are connected successively in series between a first power source node and a collector of one of said second differential transistors;

a second resistance, a second level shift element, and a third level shift element which are connected successively in series between the first power source node and a collector of the other of said first differential transistors;

a first emitter follower circuit which has an output node serving as a first latch output node and an input node connected to a series-connection node between said first resistance and said first level shift element;

a second emitter follower circuit which has an input node connected to a series-connection node between said second resistance and said second level shift element, and an output node serving as a second latch output node which pairs with the first latch output node as a complementary pair;

a current source circuit which is connected between a second power source node and an emitter-coupled node which is provided between said first differential transistors; and a third differential transistor pair consisting of third differential transistors which have emitters, respectively, connected to the collector of the other of said second differential transistors, bases respectively connected to the first latch output node and the second latch output node, and collectors respectively connected to the input node of said second emitter follower circuit and the input node of the first emitter follower circuit.

2. The differential RS latch circuit according to claim 1, wherein said first differential pair, said second differential transistor pair, and said third differential transistor pair are connected in series in three stages so as to constitute a series-gate structure, and function as a current switch; and said first level shift element is a diode and provided in a first current path between the first power source node and the second power source node, and said second and third level shift elements are diodes and connected in series to each other in a second current path between the first power source node and the second power source node, so that the number of elements provided in the first current path is equal to the number of elements provided in the second current path, and the first and second current paths ensure an equivalent response speed to any of the first and second complementary input signals, so as to prevent occurrence of a hazard.

3. The differential RS latch circuit according to claim 1, wherein said first differential transistor pair, said second differential transistor pair, and said third differential transistor pair are connected in series in three stages so as to constitute a series-gate structure, and function as a current switch; and said first level shift element is a NPN transistor and provided in a first current path between the first power source node and the second power source node, and said second and third level shift elements are NPN transistors and connected in series to each other in a second current path between the first power source node and the second power source node, so that the number of elements provided in the first current path is equal to the number of elements provided in the first current path, and the first and second current paths ensure an equivalent response speed to any of the first and second complementary input signals, so as to prevent a hazard from occurring.

4. The differential RS latch circuit according to claim 1, wherein the first complementary input signals are complementary set signals, and the second complementary input signals are complementary reset signals.

5. The differential RS latch circuit according to claim 1, wherein the first complementary input signals are complementary set signals, and the second complementary input signals are complementary reset signals.

6. The differential RS latch circuit according to claim 1, wherein said first differential transistor pair comprises bipolar transistors.

7. The differential RS latch circuit according to claim 1, characterized in that said first differential transistor pair comprises field-effect transistors (FETs).

* * * * *